United States Patent
Blevins et al.

(10) Patent No.: US 11,251,576 B2
(45) Date of Patent: Feb. 15, 2022

(54) CIRCUIT CARD WITH COHERENT INTERCONNECT

(71) Applicant: Intel Corporation, Santa Clara, CA (US)

(72) Inventors: Dirk Blevins, Russell Springs, KY (US); Gene F. Young, Lexington, SC (US); Sudeep Puligundla, Hillsboro, OR (US); Todd Langley, Gilbert, AZ (US); Kevin Bross, Tigard, OR (US); Nagabhushan Chitlur, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 797 days.

(21) Appl. No.: 15/952,741

(22) Filed: Apr. 13, 2018

(65) Prior Publication Data

US 2019/0044293 A1 Feb. 7, 2019

(51) Int. Cl.
*H01R 27/02* (2006.01)
*H01R 12/70* (2011.01)
*H05K 1/11* (2006.01)
*H05K 7/14* (2006.01)
*H05K 1/14* (2006.01)
*H01R 12/73* (2011.01)

(52) U.S. Cl.
CPC ......... *H01R 27/02* (2013.01); *H01R 12/7076* (2013.01); *H05K 1/117* (2013.01); *H05K 1/141* (2013.01); *H05K 7/1417* (2013.01); *H05K 7/1429* (2013.01); *H01R 12/73* (2013.01); *H05K 7/1487* (2013.01); *H05K 2201/09954* (2013.01); *H05K 2201/10212* (2013.01)

(58) Field of Classification Search
CPC .... H01R 27/02; H01R 12/7076; H05K 1/117; H05K 1/141; H05K 7/1417; H05K 7/1429
USPC .......................................................... 361/760
See application file for complete search history.

(56) References Cited

U.S. PATENT DOCUMENTS 5,249,143 A * 9/1993 Staley, III ............ G01R 1/0416
702/91

* cited by examiner

*Primary Examiner* — Tremesha S Willis
(74) *Attorney, Agent, or Firm* — Schwabe, Williamson & Wyatt, P.C.

(57) ABSTRACT

Apparatuses and systems associated with expansion card design with a coherent connector to provide for coherent communication are disclosed herein. In embodiments, a circuit card may comprise an integrated circuit (IC), a first connector to couple the IC to a processor of a computer device, the first connector to provide for non-coherent communication between the IC and the processor, and a second connector to couple the IC to the processor, the second connector to provide for coherent communication between the IC and the processor. Other embodiments may be described and/or claimed.

8 Claims, 7 Drawing Sheets

CIRCUIT CARD WITH COHERENT INTERCONNECT

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Peripheral component interconnect express (PCIe) circuit cards have long been implemented in computer devices. With the advent of coherency of computer devices, a desire to implement coherency within circuit cards has developed. However, coherency within the circuit cards is not easily implemented. Legacy approaches include having both a field-programmable gate array (FPGA) and processor located on the motherboard.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
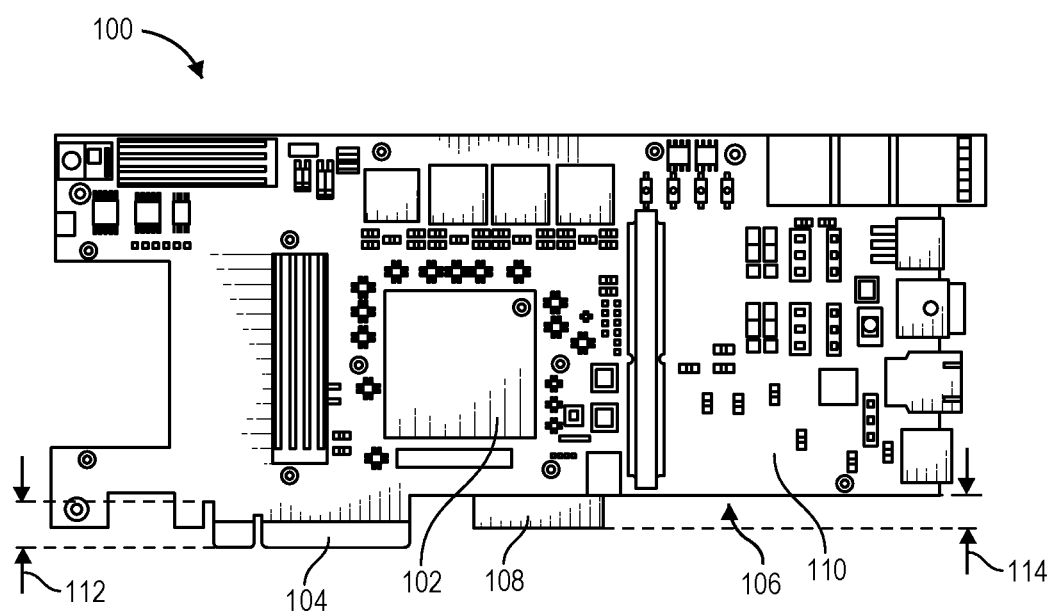
FIG. 1 illustrates an example circuit card, according to various embodiments.

Apparatuses and systems associated with circuit card design, such as expansion card design, with a coherent connector to provide coherent communication are disclosed herein. In embodiments, a circuit card may comprise an integrated circuit (IC), a first connector to couple the IC to a processor of a computer device, the first connector to provide for non-coherent communication between the IC and the processor, and a second connector to couple the IC to the processor, the second connector to provide for coherent communication between the IC and the processor. In embodiments, the circuit card may be an expansion card.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example circuit card 100, according to various embodiments. The circuit card 100 may comprise an expansion card, which may also be referred to as an add-on card, such as a PCIe add-on card. In some embodiments, the circuit card 100 may be mounted to a printed circuit board (PCB) (such as a motherboard) of a computer device (such as the computer device 202 (FIG. 2), the computer device 400 (FIG. 4), the computer device 500 (FIG. 5), the computer device 600 (FIG. 6), and/or the computer device 700 (FIG. 7)) via an add-on slot.

The circuit card 100 may include an integrated circuit (IC) 102. The IC 102 may perform one or more operations to support functions to be provided by the circuit card 100. In some embodiments, the IC 102 may comprise a field-programmable gate array (FPGA), an ASIC, or a co-processor.

The circuit card 100 may further include a first connector 104. The first connector 104 may be coupled to the IC 102. The first connector 104 may comprise a first edge finger, which may be located at a side 106 of the circuit card 100. The first connector 104 may be received by a first circuit card connector of the PCB of the computer device, wherein the first circuit card connector may be coupled to a processor (such as a central processing unit (CPU)) of the computer device. The first edge finger may comprise a portion that extends from a main body 110 of the circuit card 100 and is received by the first circuit card connector, wherein the first edge finger has one or more contacts that mate with contacts of the first circuit card connector when received. The first connector 104 may couple the IC 102 to the processor, wherein the first connector 104 supports a first transmission path between the IC 102 and the processor.

The circuit card 100 may further include a second connector 108. The second connector 108 may be coupled to the IC 102. The second connector 108 may comprise a second edge finger, which may be located at the side 106 of the circuit card 100. The second connector 108 may be received by a second circuit card connector of the PCB of the computer device, wherein the second circuit card connector may be coupled to the processor of the computer device. The second edge finger may comprise a portion that extends from the main body 110 of the circuit card 100 and is received by the second circuit card connector, wherein the second edge finger has one or more contacts that mate with contacts of the first circuit card connector when received. The second connector 108 may couple the IC 102 to the processor, wherein the second connector 108 supports a second transmission path between the IC 102 and the processor. In other embodiments, the second connector 108 may comprise a wire connector, which may connect a header of the circuit card 100 and a header of the PCB to couple the IC 102 to the processor.

The first connector 104 and the second connector 108 may extend from the main body 110 of the circuit card 100. The first connector 104 may extend from the main body 110 by a first distance 112. The second connector 108 may further extend from the main body 110 by a second distance 114. The second distance 114 of the second connector 108 may be shorter than the first distance 112 of the first connector 104. The second connector 108 being shorter than the first connector 104 may allow for backward compatibility of the circuit card 100 with legacy add-on card slots. For example, the first connector 104 may be inserted within a circuit card connector of a legacy add-on card slot of a PCB, and the second connector 108 avoids contact with the PCB while the first connector 104 is inserted within the circuit card connector.

The circuit card 100 may further include traces, vias, other connectors, interconnect elements, and/or circuitry that couples the IC 102 to the first connector 104 and the second connector 108. For example, the circuit card 100 may include circuitry that supports the connections provided by the first connector 104 and the second connector 108. The circuit card 100 may include non-coherent circuitry (see the non-coherent circuitry 214 (FIG. 2)) coupled to the first connector 104, wherein the non-coherent circuitry supports non-coherent protocol for the non-coherent connection. In some embodiments, the non-coherent circuitry may support the peripheral component interconnect express (PCIe) bus standard for the non-coherent connection. For example, the PCIe bus standard supported by the non-coherent circuitry may include communication encapsulated in serialized packets, wherein the packetizing and de-packetizing may be handled by a transaction layer of the non-coherent circuitry. The circuit card 100 may further include coherency circuitry (see the coherency circuitry 218 (FIG. 2)) coupled to the second connector 108, wherein the coherency circuitry supports coherent protocol for the coherent connection.

Figure 2:
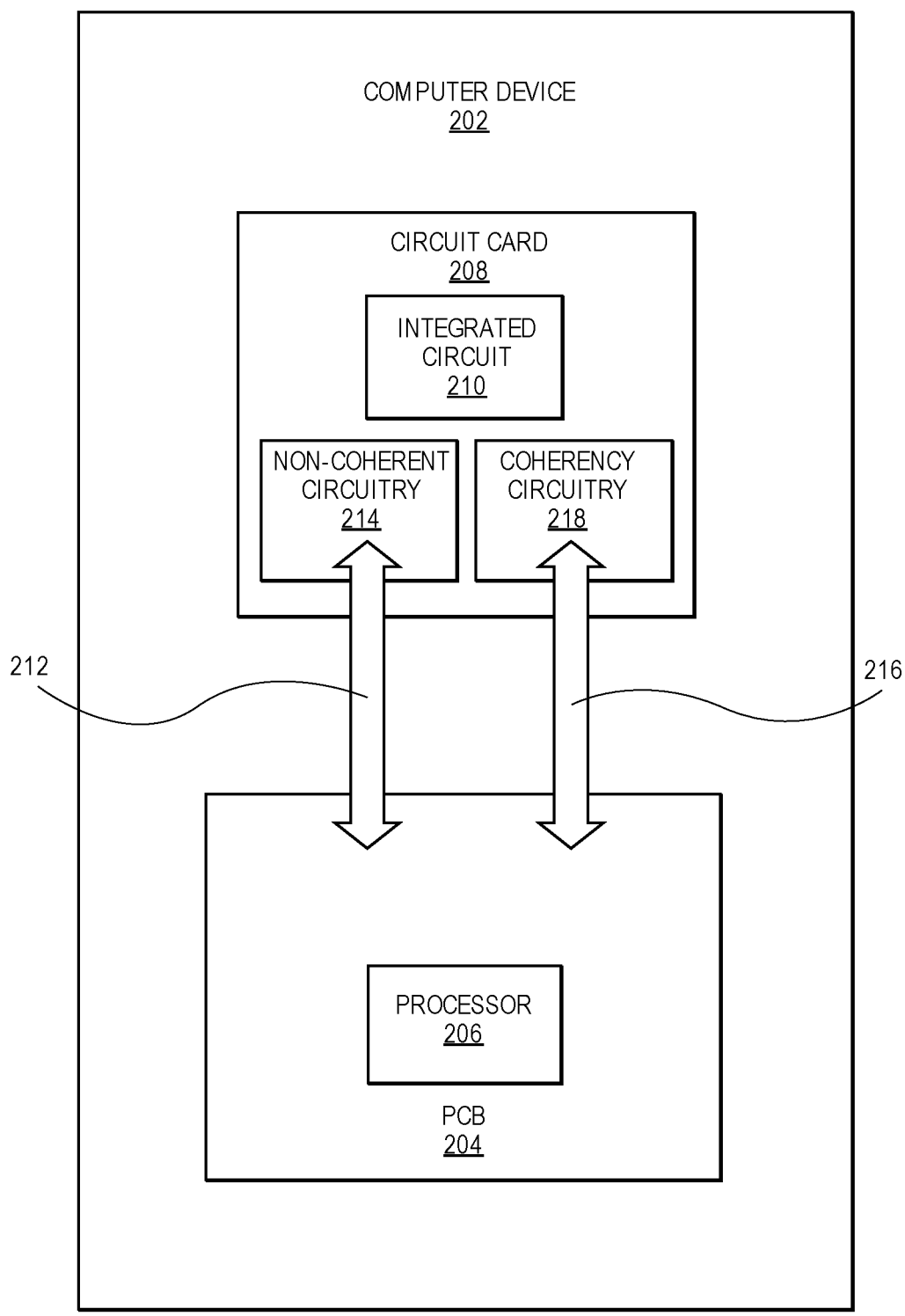
FIG. 2 illustrates a block diagram of an example computer device, according to various embodiments.

FIG. 2 illustrates a block diagram of a portion of an example computer device 202, according to various embodiments. The computer device 202 may include a PCB 204. The PCB 204 may include one or more of the features of the PCB 602 (FIG. 6) and/or the PCB 702 (FIG. 7). The computer device 202 may further include a processor 206 mounted to the PCB 204. In some embodiments, the processor 206 may comprise a central processing unit (CPU).

The computer device 202 may further include a circuit card 208. The circuit card 208 may include one or more of the features of the circuit card 100 (FIG. 1). The circuit card 208 may include an IC 210. The IC 210 may include one or more of the features of the IC 102 (FIG. 1).

The computer device 202 may include a first transmission path 212. The first transmission path 212 may couple the processor 206 and the IC 210 and may provide for non-coherent communication between the processor 206 and the IC 210. The first transmission path 212 may include a first connector. The first connector may include one or more of the features of the first connector 104 (FIG. 1) and may provide a non-coherent connection between the processor 206 and the IC 210.

The first transmission path 212 may further include non-coherent circuitry 214 to implement non-coherent communication between the processor 206 and the IC 210. The non-coherent circuitry 214 may include traces, vias, other connectors, interconnect elements, circuit elements, or some combination thereof, that couple the processor 206 and the IC 210.

The computer device 202 may further include a second transmission path 216. The second transmission path 216 may couple the processor 206 and the IC 210 and may provide for coherent communication between the processor 206 and the IC 210. The second transmission path 216 may include a second connector. The second connector may include one or more of the features of the second connector 108 (FIG. 1) and may provide a coherent connection between the processor 206 and the IC 210.

The second transmission path 216 may further include coherency circuitry 218 to implement coherent communication between the processor 206 and the IC 210. In particular, the coherency circuitry 218 may support and/or perform operations for implementation of a coherent system, including, but not limited to, updating all key elements (such as memory, caches, input/output elements, and/or other storage elements) based on an update to one element and/or maintaining indications that coherency of data has been implemented. The coherency circuitry 218 may further implement one or more coherent protocols (e.g. snoop coherency, MSI, MESI, MOSI, MOESI, MERSI, MESIF, write-once, Synapse, Berkeley, Firefly, and Dragon protocols). The coherency circuitry 218 may include traces, vias, other connectors, interconnect elements, circuit elements, or some combination thereof, that couple the processor 206 and the IC 210.

Figure 3:
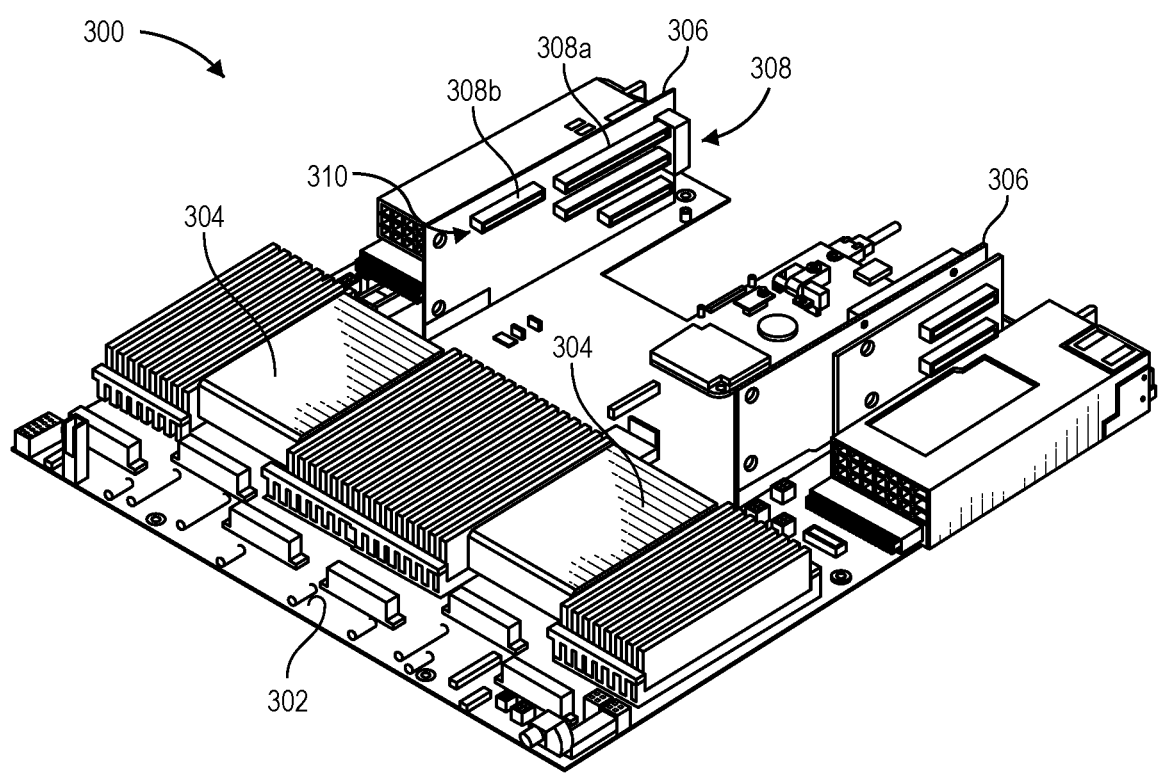
FIG. 3 illustrates an example computing platform assembly, according to various embodiments.

FIG. 3 illustrates an example computing platform assembly 300, according to various embodiments. The illustrated embodiment of the computing platform assembly 300 illustrates an example assembly for a server. It is to be understood that the computing platform assembly 300, or portions thereof described, may be used to form various computer devices, including desktop computers, laptop computers, tablets, cell phones, other similar computer devices, or some combination thereof.

The computing platform assembly 300 may include a PCB 302. The PCB 302 may be representative of the PCB 204 (FIG. 2). Further, the PCB 302 may include one or more of the features of the PCB 602 (FIG. 6) and/or the PCB 702 (FIG. 7).

The computing platform assembly 300 may include one or more processors 304. The processors 304 may be mounted to the PCB 302. The processors 304 may be representative of the processor 206 (FIG. 2). An integrated circuit (such as the integrated circuit 210 (FIG. 2)) may be coupled to one or more of the processors 304 via a first transmission path (such as the first transmission path 212 (FIG. 2)) and a second transmission path (such as the second transmission path 216 (FIG. 2)). The processors 304 may perform one or more of the operations of the server. In some embodiments, the processors 304 may comprise CPUs of the server.

The computing platform assembly 300 may further include one or more extender cards 306. The extender cards 306 may include one or more riser cards. The extender cards 306 may be mounted to the PCB 302 and may be coupled to one or more of the processors 304. The extender cards 306 may include one or more circuit card connectors 308. The circuit card connectors 308 may receive circuit cards (such as the circuit card 100 (FIG. 1) and/or the circuit card 208 (FIG. 2)) and may provide for coupling between one or more of the circuit cards and one or more of the processors 304.

In some embodiments, the extender cards 306 may include slots, wherein each slot is to receive a single circuit card. Each of the slots may include one or more of the circuit card connectors 308 that are to receive portions of the circuit card. In the illustrated embodiment, a first slot 310 may include a first circuit card connector 308*a* and a second circuit card connector 308*b*. The first circuit card connector 308*a* may be located adjacent to the second circuit card connector 308*b*. The first circuit card connector 308*a* may receive a first connector (such as the first connector 104 (FIG. 1)) of a circuit card and the second circuit card connector 308*b* may receive a second connector (such as the second connector 108 (FIG. 1)) of the circuit card. In other embodiments, the extender cards 306 may be omitted and the circuit card connectors 308 may be mounted directly to the PCB 302.

In some embodiments, the computing platform assembly 300 may include other circuitry and/or electronic components, including, but not limited to, graphics processors, signal processors, memory, a solid state drives, transceivers, global positioning systems, sensors, and so forth.

Figure 4:
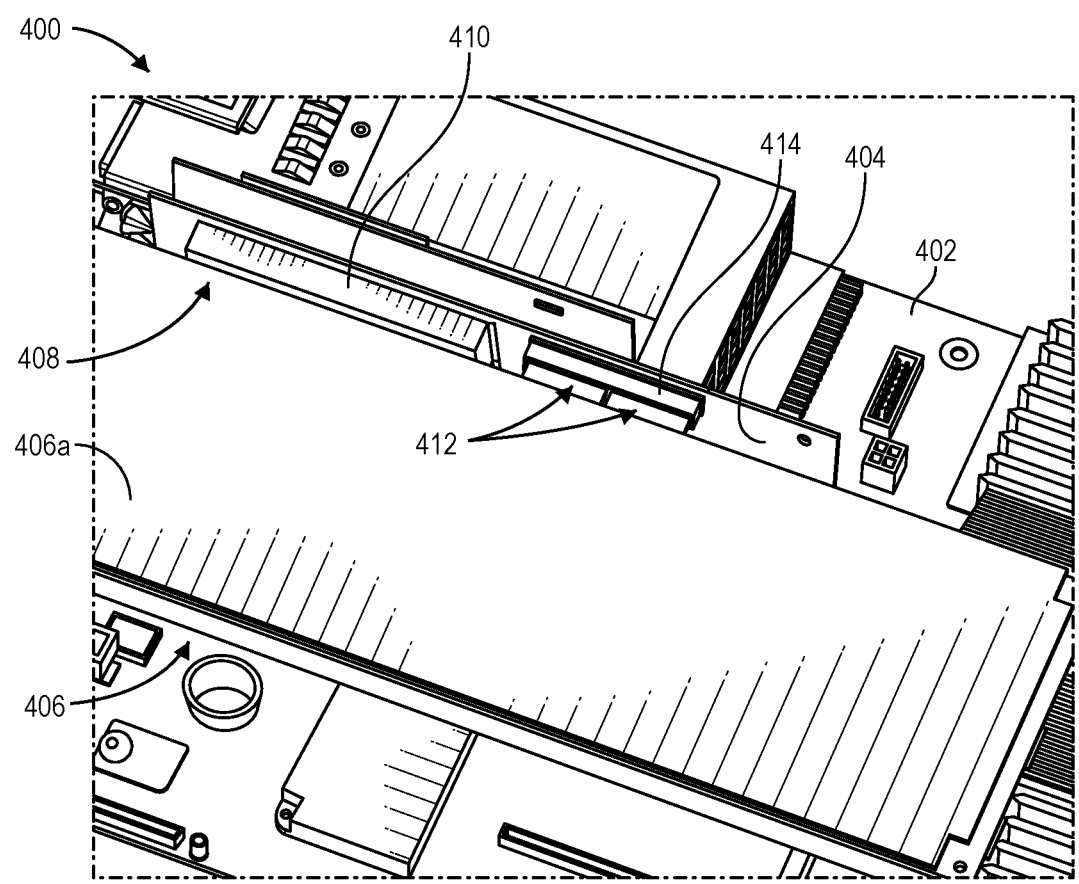
FIG. 4 illustrates a portion of an example of a computer device, according to various embodiments.

FIG. 4 illustrates a portion of an example of a computer device 400, according to various embodiments. The illustrated portion of the computer device 400 may be representative of, and/or implemented within, the computer device 500 (FIG. 5), the computer device 600 (FIG. 6), and/or the computer device 700 (FIG. 7). Further, the computer device 400 may include one or more of the features of the computing platform assembly 300 (FIG. 3), including the processors 304 (FIG. 3).

The computer device 400 may include a PCB 402. The PCB 402 may include one or more of the features of the PCB 302 (FIG. 3), including having at least one processor (such as the processors 304) mounted to the PCB 402. The computer device 400 may further include an extender card 404 mounted to the PCB 402. The extender card 404 may include one or more of the features of the extender cards 306 (FIG. 3).

The computer device 400 may further include one or more circuit cards 406. The circuit cards 406 may include one or more of the features of the circuit card 100 (FIG. 1). In the illustrated embodiment, a single circuit card 406*a* is illustrated. The circuit card 406*a* may be mounted to the extender card 404. In particular, a first connector 408 of the circuit card 406*a* may be located within a first circuit card connector 410 of the extender card 404 and a second connector 412 of the circuit card 406*a* may be located within a second circuit card connector 414 of the extender card 404. The first circuit card connector 410 may be located adjacent to the second circuit card connector 414.

The first connector 408 and the second connector 412 may each couple an IC (such as the IC 102 (FIG. 1) and/or the IC 210 (FIG. 2)) of the circuit card 406*a* to a processor (such as the processor 206 (FIG. 2) and/or the processors 304) mounted to the PCB 402. For example, the first connector 408 may be part of a first transmission path that provides for non-coherent communication between the IC and the processor. Further, the second connector 412 may be part of a second transmission path that provides for coherent communication between the IC and the processor.

Figure 5:
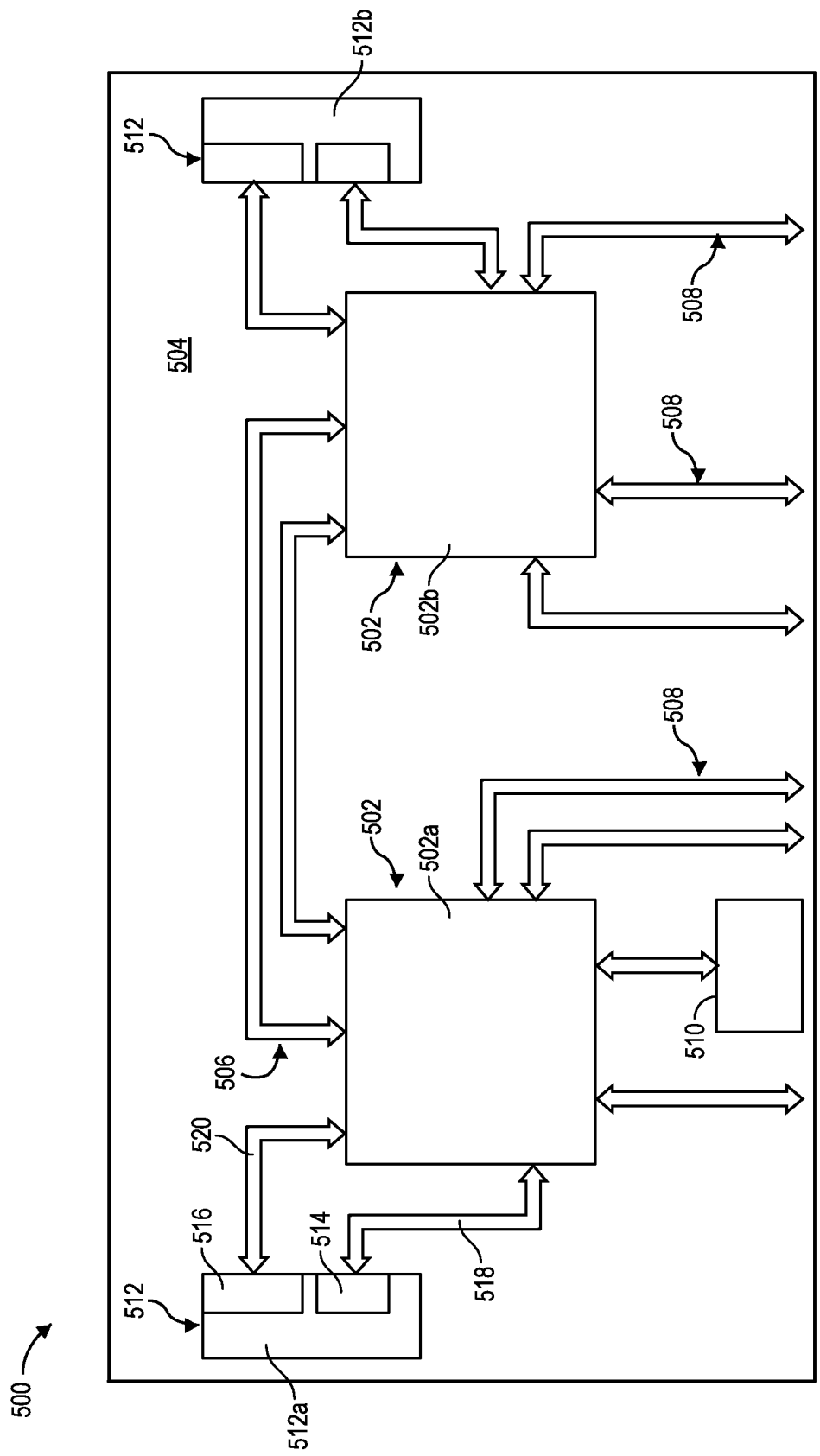
FIG. 5 illustrates a block diagram of a portion of an example computer device, according to various embodiments.

FIG. 5 illustrates a block diagram of a portion of an example computer device 500, according to various embodiments. The computer device 500 may include one or more of the features of the computer device 400 (FIG. 4). The computer device 500 may include one or more processors 502. The processors 502 may include one or more of the features of the processor 206 (FIG. 2) and/or the processors 304 (FIG. 3).

The computer device 500 may further include a PCB 504. The processors 502 may be mounted to the PCB 504. The PCB 504 may include one or more of processor interconnect paths 506 between the processors 502. The processor interconnect paths 506 may provide paths for communication between the processors 502. The processor interconnect paths 506 may provide for coherent communication between the processors 502. In some embodiments, the processor interconnect paths 506 may provide for non-coherent communication, or some combination of coherent and non-coherent communication, between the processors 502. The PCB 504 may further include one or more element interconnect paths 508. The element interconnect paths 508 may couple the processors 502 to other elements within the computer device 500 (such as the controller 510) and provide for communication between the processors 502 and the other elements.

The computer device 500 may further include one or more slots 512. The slots 512 may include one or more of the features of the slots (such as the first slot 310 (FIG. 3)) described in relation to FIG. 3. Each of the slots may receive a circuit card, such as the circuit card 100 (FIG. 1), the circuit card 208 (FIG. 2), and/or the circuit cards 406 (FIG. 4). The illustrated embodiment includes a first slot 512*a* and a second slot 512*b*. The first slot 512*a* may be coupled to a first processor 502*a* and the second slot 512*b* may be coupled to a second processor 502*b*. For brevity, the first slot 512*a* and the first processor 502*a* are described. It is to be understood that the second slot 512*b* and the second processor 502*b* may include one or more of the features described in relation to the first slot 512*a* and the first processor 502*a*.

The first slot 512*a* may include a first circuit card connector 514 and a second circuit card connector 516. The first circuit card connector 514 may receive a first connector (such as the first connector 104 (FIG. 1) and/or the first connector 408 (FIG. 4)) of a circuit card. The second circuit card connector 516 may receive a second connector (such as the second connector 108 (FIG. 1) and/or the second connector 412 (FIG. 4)). The PCB 504 may include a first connector interconnect path 518 that couples the first processor 502*a* and the first circuit card connector 514. The PCB 504 may further include a second connector interconnect path 520 that couples the second processor 502*b* and the second circuit card connector 516. The first circuit card connector 514 may be utilized for non-coherent communication between the first processor 502*a* and an IC (such as the IC 102 (FIG. 1) and/or the IC 210 (FIG. 2)) of a circuit card received by the first circuit card connector 514. Further, the second circuit card connector 516 may be utilized for coherent communication between the first processor 502a and the IC.

Figure 6:
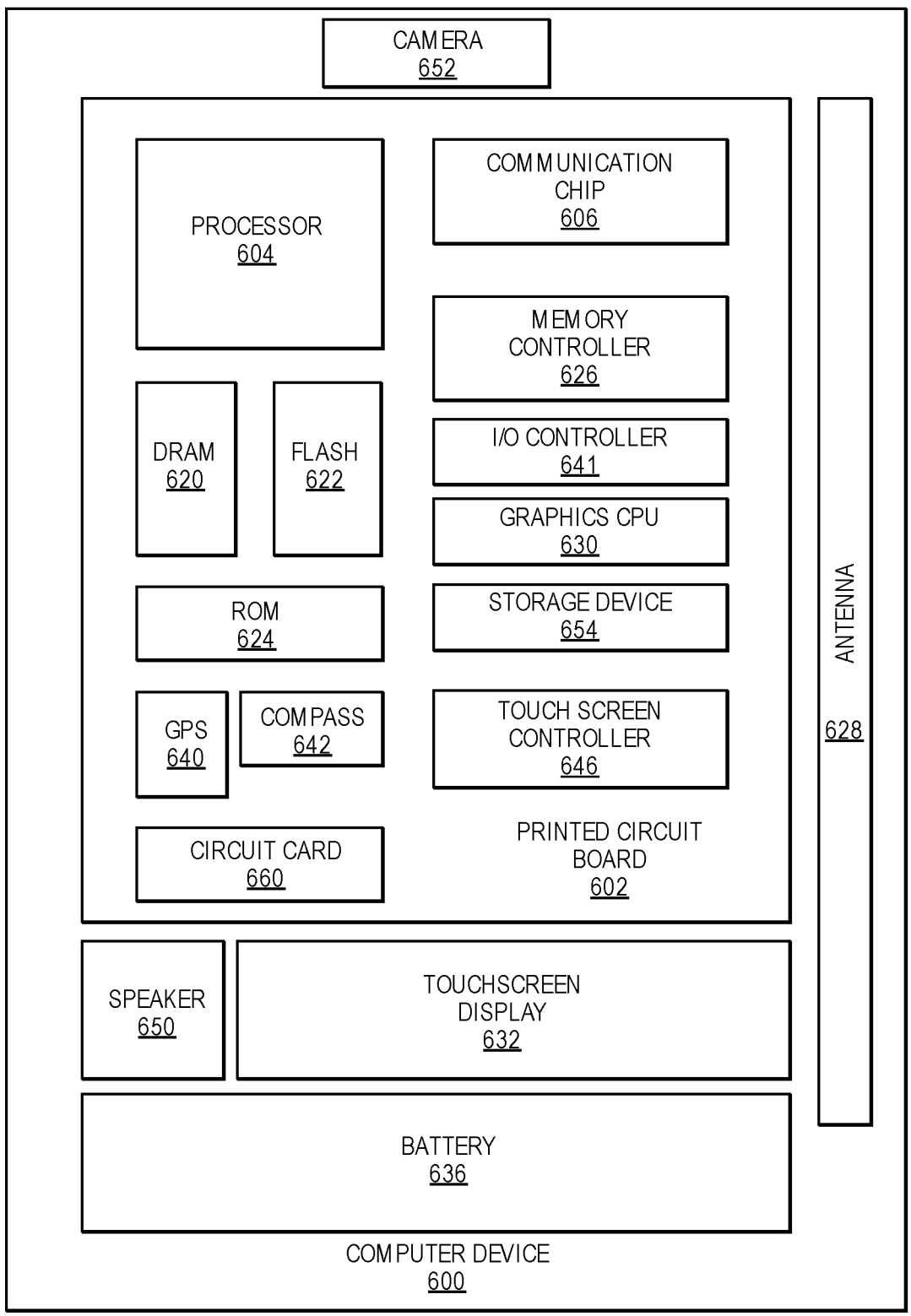
FIG. 6 illustrates another example computer device that may employ the apparatuses and/or methods described herein.
Figure 7:
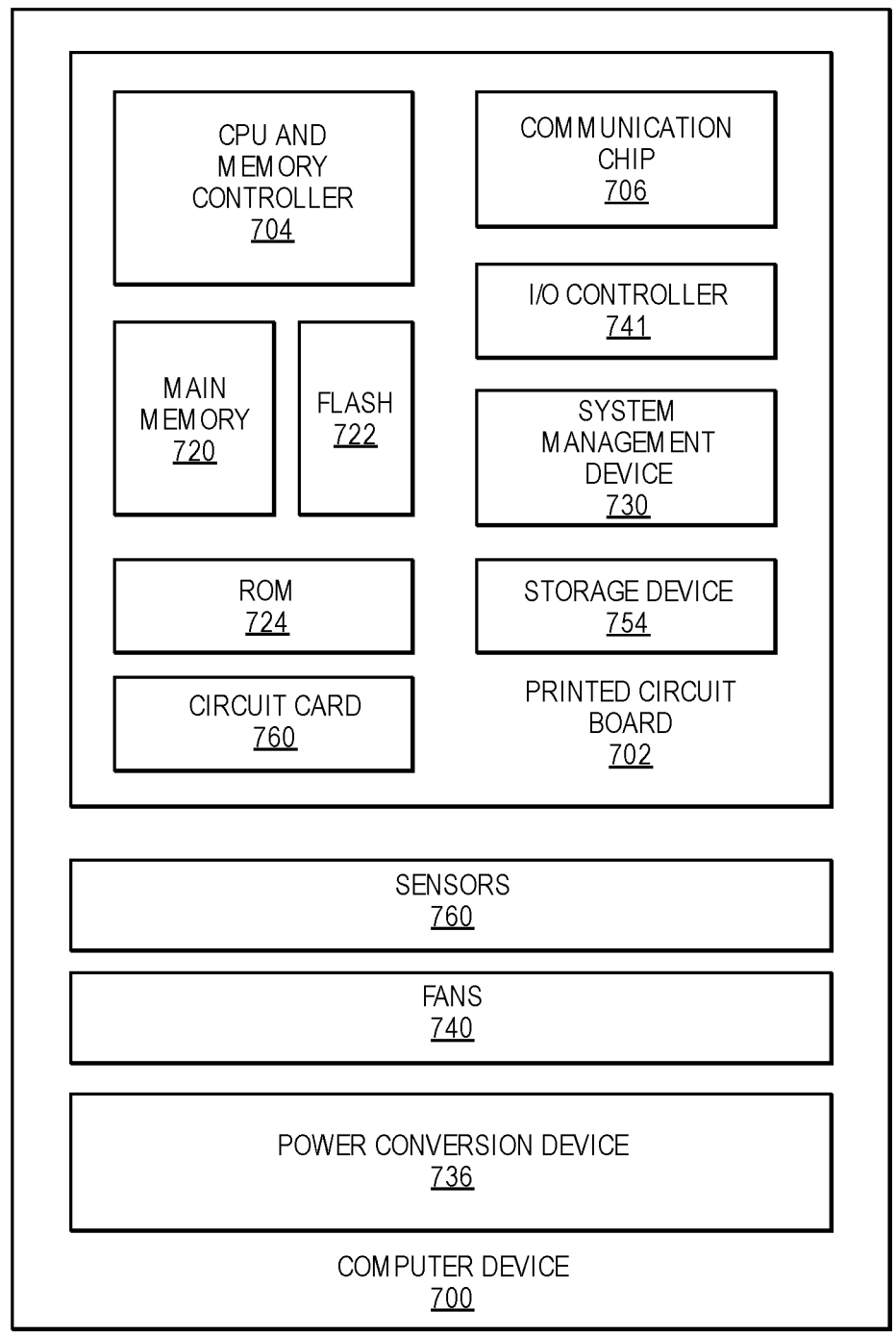
FIG. 7 illustrates another example computer device that may employ the apparatuses and/or methods described herein.

FIG. 6 illustrates an example computer device 600 that may employ the apparatuses and/or methods described herein (e.g., the circuit card 100, the computer device 202, the computing platform assembly 300, the computer device 400, and/or the computer device 500), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computer device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read-only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to implement an operating system and/or one or more applications. In various embodiments, these aspects may additionally or alternatively be implemented using hardware separate from the one or more processor(s) 604, flash memory 622, or storage device 654.

In various embodiments, the computer device 600 may include one or more circuit cards 660. The circuit cards 660 may include one or more of the features of the circuit card 100 (FIG. 1), the circuit card 208 (FIG. 2), and/or the circuit cards 406 (FIG. 4). The computer device 600 may further include one or more circuit card connectors mounted to the PCB 602, wherein the circuit card connectors receive connectors of the circuit cards 660. The circuit card connectors may include one or more of the circuit card connectors 308 (FIG. 3), the first circuit card connector 410 (FIG. 4), the second circuit card connector 414 (FIG. 4), the first circuit card connector 514 (FIG. 5), and/or the second circuit card connector 516 (FIG. 5). The computer device 600 may further include one or more transmission paths (such as the first transmission path 212 (FIG. 2) and/or the second transmission path 216 (FIG. 2)) between an IC (such as the IC 102 (FIG. 1) and/or the IC 210 (FIG. 2)) of each, or a portion, of the circuit cards 660 and the processors 604.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

In some embodiments, a portion of the computer device 600 may be referred to as a computing platform. For example, the PCB 602 and the features (the processor 604, the DRAM 620, the flash memory 622, the ROM 624, the GPS 640, the compass 642, the communication chips 606, the memory controller 626, the I/O controller 641, the graphics CPU 630, the storage device 654, and/or the touch screen controller 646) mounted to the PCB 602 may be referred to as a computing platform. The computing platform may be manufactured separate from portions of the computer device 600 (such as a chassis of the computer device 600, I/O devices of the computer device, etc.) and may be installed into a computer device, such as the computer device 600, by an end user.

FIG. 7 illustrates an example computer device 700 that may employ the apparatuses and/or methods described herein (e.g., the circuit card 100, the computer device 202, the computing platform assembly 300, the computer device 400, and/or the computer device 500), in accordance with various embodiments. As shown, computer device 700 may include a number of components, such as one or more processor and memory controller device(s) 704 (one shown) and at least one communication chip 706. In various embodiments, the one or more processor and memory controller device(s) 704 each may include one or more processor cores. In various embodiments, the at least one communication chip 706 may be physically and electrically coupled to the one or more processor and memory controller device(s) 704. In further implementations, the communication chip 706 may be part of the one or more processor and memory controller device(s) 704.

Further, in various embodiments, a system management device 730 (such as baseboard management controller (BMC)) may be coupled to the one or more processor and memory controller device(s) 704. The system management device 730 may monitor the state of the computer device 700 via one or more sensors 760. The one or more sensors 760 may sense the physical state of the computer device 700, such as a temperature of the computer device 700. In some embodiments, the system management device 730 may communicate with the one or more processor and memory controller device(s) 704 through an independent connection. Further, in some embodiments, the system management device 730 and/or the sensors 760 may be omitted.

In various embodiments, computer device 700 may include printed circuit board (PCB) 702. For these embodiments, the one or more processor and memory controller device(s) 704 and communication chip 706 may be disposed thereon. In alternate embodiments, the various components may be coupled without the employment of PCB 702. Depending on its applications, computer device 700 may include other components that may or may not be physically and electrically coupled to the PCB 702. These other components include, but are not limited to, main memory (e.g., volatile memory, non-volatile memory, and/or dynamic random access memory (DRAM)) 720, read-only memory (ROM) 724, flash memory 722, storage device 754 (e.g., a hard-disk drive (HDD)), an I/O controller 741, a digital signal processor (not shown), a crypto processor (not shown), a system management device 730, a display (not shown), a power conversion device 736, an audio codec (not shown), a video codec (not shown), and a mass storage device (such as hard disk drive, a solid state drive, compact disk (CD), digital versatile disk (DVD)) (not shown), and so forth.

In various embodiments, the computer device 700 may include one or more fans 740. The one or more fans 740 may be directed at and/or mounted to one or more of the components within the computer device 700. In some embodiments, the one or more fans 740 may be coupled to the one or more processor and memory controller device(s) 704 and/or the system management device 730, which may control operation of the one or more fans 740.

In some embodiments, the one or more processor and memory controller device(s) 704, flash memory 722, and/or storage device 754 may include associated firmware (not shown) storing programming instructions configured to enable computer device 700, in response to execution of the programming instructions by one or more processor and memory controller device(s) 704, to practice all or selected aspects of the methods described herein. In various embodiments, these aspects may additionally or alternatively be implemented using hardware separate from the one or more processor and memory controller device(s) 704, flash memory 722, or storage device 754.

The communication chips 706 may enable wired and/or wireless communications for the transfer of data to and from the computer device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 700 may include a plurality of communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others.

In various embodiments, the computer device 700 may include one or more circuit cards 760. The circuit cards 760 may include one or more of the features of the circuit card 100 (FIG. 1), the circuit card 208 (FIG. 2), and/or the circuit cards 406 (FIG. 4). The computer device 700 may further include one or more circuit card connectors mounted to the PCB 702, wherein the circuit card connectors receive connectors of the circuit cards 760. The circuit card connectors may include one or more of the circuit card connectors 308 (FIG. 3), the first circuit card connector 410 (FIG. 4), the second circuit card connector 414 (FIG. 4), the first circuit card connector 514 (FIG. 5), and/or the second circuit card connector 516 (FIG. 5). The computer device 700 may further include one or more transmission paths (such as the first transmission path 212 (FIG. 2) and/or the second transmission path 216 (FIG. 2)) between an IC (such as the IC 102 (FIG. 1) and/or the IC 210 (FIG. 2)) of each, or a portion, of the circuit cards 760 and the processors 704.

In various implementations, the computer device 700 may be a server. In other implementations, the computer device 700 may be, or components of the computer device 700 may be implemented in, a laptop, a netbook, a notebook, an ultrabook, a smartphone, a computer tablet, a personal digital assistant (PDA), an ultra-mobile PC, a mobile phone, a desktop computer, a printer, a scanner, a monitor, a set-top box, an entertainment control unit (e.g., a gaming console or automotive entertainment unit), a digital camera, an appliance, a portable music player, or a digital video recorder. In further implementations, the computer device 700 may be any other electronic device that processes data.

In some embodiments, a portion of the computer device 700 may be referred to as a computing platform. For example, the PCB 702 and the features (the CPU and memory controller 704, the main memory 720, the flash memory 722, the ROM 724, the communication chips 706, the I/O controller 741, the system management device 730, and/or the storage device 754) mounted to the PCB 702 may be referred to as a computing platform. The computing platform may be manufactured separate from portions of the computer device 700 (such as a chassis of the computer device 700, I/O devices of the computer device, etc.) and may be installed into a computer device, such as the computer device 700, by an end user.

Example 1 may include a circuit card, comprising an integrated circuit (IC), a first connector to couple the IC to a processor of a computer device, the first connector to provide for non-coherent communication between the IC and the processor, and a second connector to couple the IC to the processor, the second connector to provide for coherent communication between the IC and the processor.

Example 2 may include the circuit card of example 1, wherein the first connector is to allow for implementation of a peripheral component interconnect express (PCIe) bus standard for the non-coherent communication between the IC and the processor.

Example 3 may include the circuit card of example 1 or 2, wherein the first connector includes a first edge finger located at a side of the circuit card, and wherein the second connector includes a second edge finger located at the side of the circuit card.

Example 4 may include the circuit card of example 3, wherein the first edge finger is to be received by a first circuit card connector of the computer device and the second edge finger is to be received by a second circuit card connector of the computer device, and wherein the first circuit card connector is located adjacent to the second circuit card connector.

Example 5 may include the circuit card of example 3, wherein the second edge finger is shorter than the first edge finger.

Example 6 may include the circuit card of example 1 or 2, further comprising coherency circuitry coupled to the second connector, wherein the coherency circuitry is to support coherent protocol for the coherent communication.

Example 7 may include the circuit card of example 1 or 2, wherein the IC comprises a field-programmable gate array (FPGA).

Example 8 may include the circuit card of example 1 or 2, wherein the processor is co-disposed with the circuit card in the computer device.

Example 9 may include a computing platform, comprising a processor mounted to a printed circuit board (PCB) of the computing platform, an integrated circuit (IC) mounted to a circuit card, the circuit card being coupled to the PCB, a first transmission path that couples the processor and the IC, wherein the first transmission path provides for non-coherent communication between the IC and the processor, and a second transmission path that couples the processor and the IC, wherein the second transmission path provides for coherent communication between the IC and the processor.

Example 10 may include the computing platform of example 9, wherein the second transmission path utilizes coherency circuitry to implement coherency for the coherent communication.

Example 11 may include the computing platform of example 9 or 10, wherein the first transmission path utilizes a first edge finger of the circuit card, and wherein the second transmission path utilizes a second edge finger of the circuit card.

Example 12 may include the computing platform of example 11, wherein the second edge finger is shorter than the first edge finger.

Example 13 may include the computing platform of example 11, further comprising a first card connector mounted to the PCB, wherein the first card connector receives the first edge finger, and a second card connector mounted to the PCB, wherein the second card connector receives the second edge finger and is located adjacent to the first card connector.

Example 14 may include the computing platform of example 9 or 10, wherein the first transmission path is to implement a peripheral component interconnect express (PCIe) bus standard for the non-coherent communication.

Example 15 may include the computing platform of example 9 or 10, wherein the IC comprises a field-programmable gate array (FPGA).

Example 16 may include a computer device, comprising a printed circuit board (PCB) having a processor mounted to the PCB, and a circuit card having an integrated circuit (IC) mounted to the circuit card, wherein the circuit card includes a first edge finger located within a first circuit card connector of the PCB, wherein the first edge finger couples the IC to the PCB to provide a non-coherent transmission path between the IC and the PCB, and a second edge finger located within a second circuit card connector of the PCB, wherein the second edge finger couples the IC to the PCB to provide a coherent transmission path between the IC and the PCB.

Example 17 may include the computer device of example 16, wherein the first edge finger and the second edge finger are located at a side of the circuit card.

Example 18 may include the computer device of example 16 or 17, wherein the second edge finger is shorter than the first edge finger.

Example 19 may include the computer device of example 16 or 17, further comprising coherency circuitry coupled to the second edge finger, the coherency circuitry to provide coherency for the coherent transmission path.

Example 20 may include the computer device of example 16 or 17, wherein the computer device comprises a server.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A circuit card, comprising: a body of the circuit card, wherein the body includes a recess provided in a side of the body: an integrated circuit (IC) disposed in the body of the circuit card; a first connector to couple the IC to a processor of a computer device via a first circuit card connector of a printed circuit board (PCB) of the computer device that houses the processor, wherein the first connector is to provide for non-coherent communication between the IC of the circuit card and the processor, wherein the first connector comprises a first edge finger that extends from the side of the circuit card outside of the recess in the body of the circuit card, in a same plane as the body of the circuit card, wherein a side of the first edge finger forms a side of the recess in the body of the circuit card; and a second connector to couple the IC to the processor via a second circuit card connector of the PCB of the computer device that houses the processor, the second connector to provide for coherent communication between the IC and the processor, wherein the second connector comprises a second edge finger that extends from the recess provided in the side of the body of the circuit card, in the same plane as the body of the circuit card, wherein the second edge finger is shorter than the first edge finger.

2. The circuit card of claim 1, wherein the first connector is to allow for implementation of a peripheral component interconnect express (PCIe) bus standard for the non-coherent communication between the IC and the processor.

3. The circuit card of claim 1, wherein the first circuit card connector is located adjacent to the second circuit card connector.

4. The circuit card of claim 1, further comprising coherency circuitry coupled to the second connector, wherein the coherency circuitry is to support coherent protocol for the coherent communication.

5. The circuit card of claim 1, wherein the IC comprises a field-programmable gate array (FPGA).

6. A computer device, comprising:
a printed circuit board (PCB) having a processor mounted to the PCB; and
a circuit card having:
a body that includes a recess provided in a side of the body;
an integrated circuit (IC) mounted in the body of the circuit card;
a first edge finger located within a first circuit card connector of the PCB, wherein the first edge finger couples the IC to the PCB to provide a non-coherent transmission path between the IC and the PCB, wherein the first edge finger extends from the side of the circuit card outside of the recess in the body of the circuit card, in a same plane as the body of the circuit card, wherein a side of the first edge finger forms a side of the recess in the body of the circuit card; and
a second edge finger located within a second circuit card connector of the PCB, wherein the second edge finger couples the IC to the PCB to provide a coherent transmission path between the IC and the PCB, wherein the second edge finger extends from the recess provided in the side of the body of the circuit card, in the same plane as the body of the circuit card,
wherein the second edge finger is shorter than the first edge finger.

7. The computer device of claim 6, further comprising coherency circuitry coupled to the second edge finger, the coherency circuitry to provide coherency for the coherent transmission path.

8. The computer device of claim 6, wherein the computer device comprises a server.

* * * * *